United States Patent
Maruo et al.

(10) Patent No.: US 8,805,311 B2
(45) Date of Patent: Aug. 12, 2014

(54) FILTER UNIT, MOBILE COMMUNICATION TERMINAL TEST SYSTEM, AND MOBILE COMMUNICATION TERMINAL TEST METHOD

(75) Inventors: Tomohiko Maruo, Atsugi (JP); Hiroshi Watanabe, Atsugi (JP); Seiichi Ishizaki, Atsugi (JP)

(73) Assignee: Anritsu Corporation, Atsugi-Shi (JP)

( * ) Notice: Subject to any disclaimer, the term of this patent is extended or adjusted under 35 U.S.C. 154(b) by 376 days.

(21) Appl. No.: 12/868,978

(22) Filed: Aug. 26, 2010

(65) Prior Publication Data

US 2011/0053622 A1 Mar. 3, 2011

(30) Foreign Application Priority Data

Aug. 26, 2009 (JP) ................ 2009-195142

(51) Int. Cl.
- *H04B 15/00* (2006.01)
- *H03J 1/00* (2006.01)
- *H04B 1/10* (2006.01)

(52) U.S. Cl.
CPC *H03J 1/00* (2013.01); *H04B 1/1027* (2013.01)
USPC ............ 455/150.1; 455/67.11; 455/67.14

(58) Field of Classification Search
CPC ................ H03J 1/00; H04B 1/1027
See application file for complete search history.

(56) References Cited

U.S. PATENT DOCUMENTS

| | | | | |
|---|---|---|---|---|
| 3,783,409 A | * | 1/1974 | Polson, Jr. ............... 331/177 R |
| 4,320,523 A | * | 3/1982 | Horikawa et al. ............ 375/350 |
| 4,363,006 A | * | 12/1982 | Ishigaki et al. ............. 333/14 |
| 4,945,324 A | * | 7/1990 | Murakami et al. ........... 333/202 |
| 5,418,507 A | * | 5/1995 | Keane et al. ................ 333/202 |
| 5,508,661 A | * | 4/1996 | Keane et al. .................. 331/37 |
| 5,955,987 A | * | 9/1999 | Murphy et al. .......... 342/357.29 |
| 2007/0121756 A1 | * | 5/2007 | Humphreys et al. .......... 375/295 |
| 2009/0092177 A1 | * | 4/2009 | Dvorak et al. ............... 375/224 |

FOREIGN PATENT DOCUMENTS

JP 2006-128913 A 5/2006

\* cited by examiner

*Primary Examiner* — Zhiyu Lu

(74) *Attorney, Agent, or Firm* — Pearne & Gordon LLP

(57) ABSTRACT

[Problem] To provide a band stop filter unit, a mobile communication terminal test system, and a mobile communication terminal test method that are flexibly adaptable to the addition/change of a specification in a frequency band for mobile communication.

[Means for Resolution] There are provided a first variable filter (102) and a second variable filter (103) which are connected to each other in series, respectively have YIG elements to vary tuning frequencies (f1 and f2), and attenuate the desired signal within predetermined bandwidths (ΔBW1 and ΔBW2) having centers of the tuning frequencies. The tuning frequency (f1) and the tuning frequency (f2) are controlled to be the same as each other or around each other when the desired signal is located at a low frequency band side. The tuning frequency (f1) and the tuning frequency (f2) are controlled to include the desired signal in a connected bandwidth and to make the connected bandwidth wider than any of the predetermined bandwidth (ΔBW1) and the predetermined bandwidth (ΔBW2) when the desired signal is located at a high frequency band side.

12 Claims, 6 Drawing Sheets

FIG.1
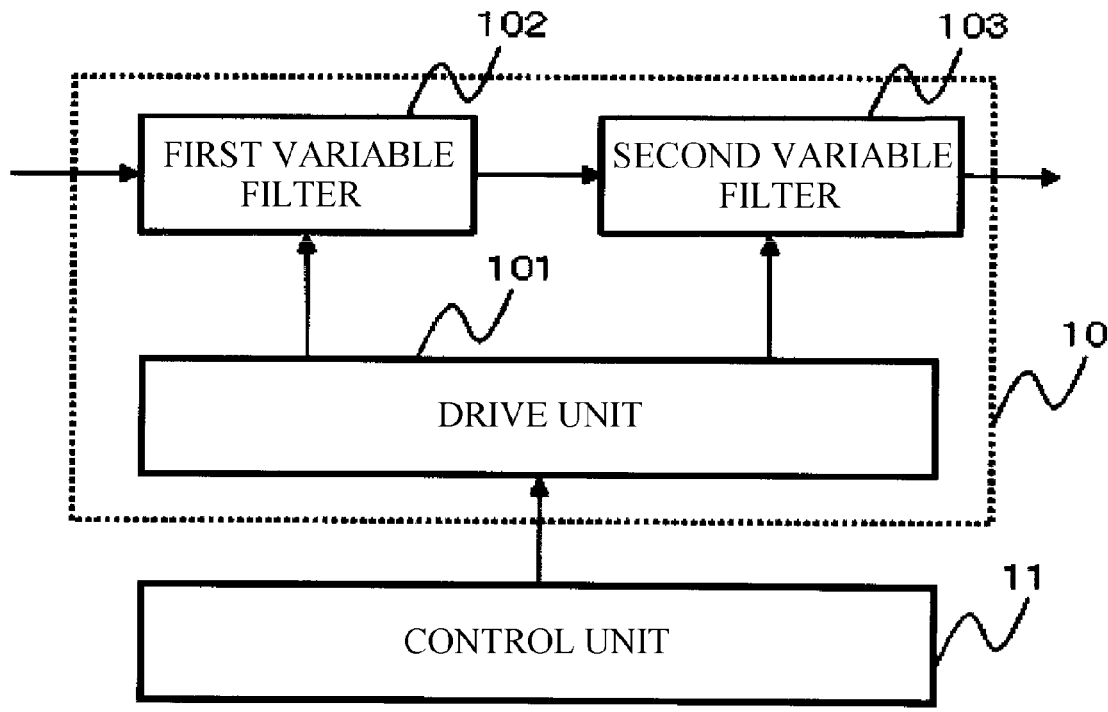
FIG.2
(a). SCHEME OF RELATED ART
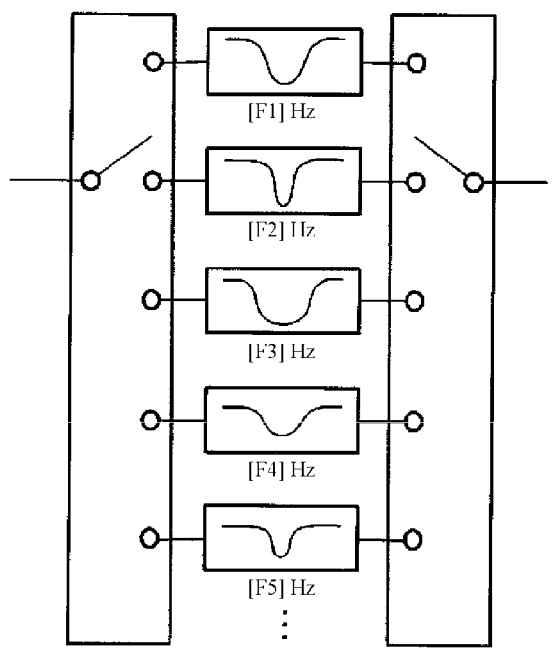
(b). SCHEME OF PRESENT INVENTION
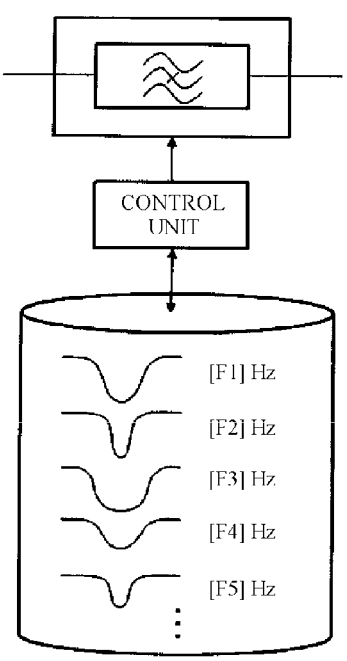

FIG. 3

(a). FREQUENCY BANDWIDTH OF FILTER

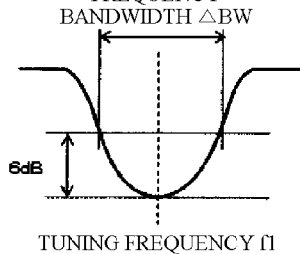

TUNING FREQUENCY f1

(b). ATTENUATION OF SIGNAL BY FILTER UNIT

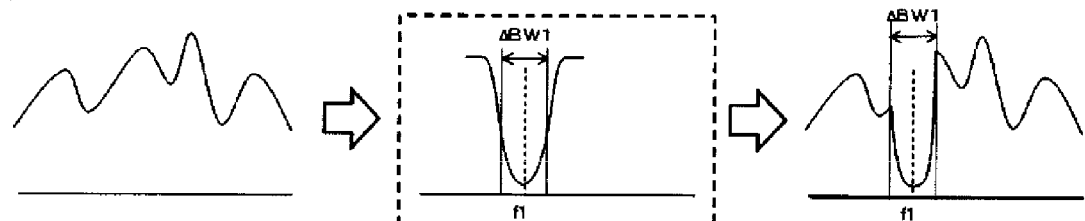

(b11). INPUT SIGNAL TO
VARIABLE FILTER 1
(INPUT SIGNAL TO FILTER UNIT)

(b12). CHARACTERISTICS OF
VARIABLE FILTER 1

(b13) OUTPUT SIGNAL FROM
VARIABLE FILTER 1

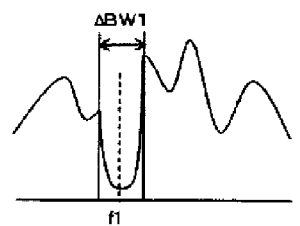 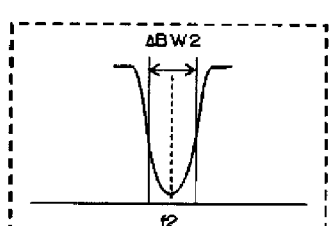 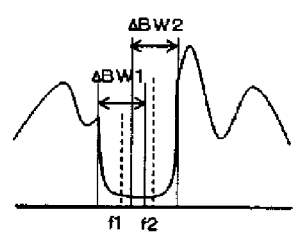

(b21). INPUT SIGNAL TO
VARIABLE FILTER 2
(OUTPUT SIGNAL FROM
VARIABLE FILTER 1)

(b22). CHARACTERISTICS OF
VARIABLE FILTER 2

(b23). OUTPUT SIGNAL FROM
VARIABLE FILTER 2
(OUTPUT SIGNAL FROM
FILTER UNIT)

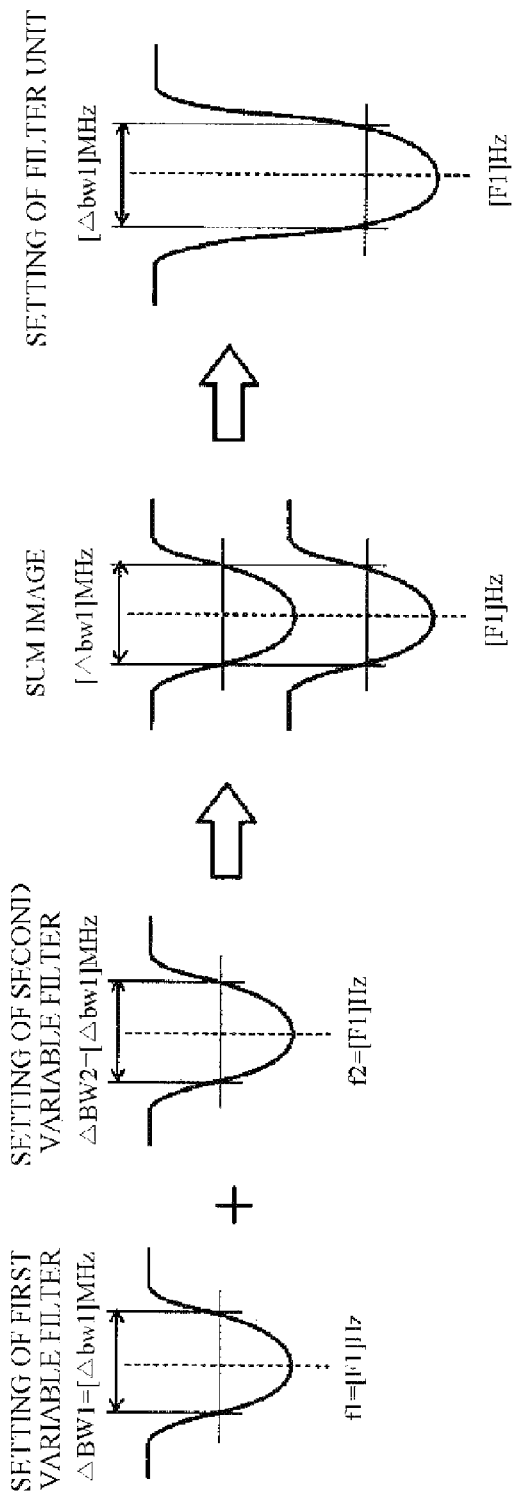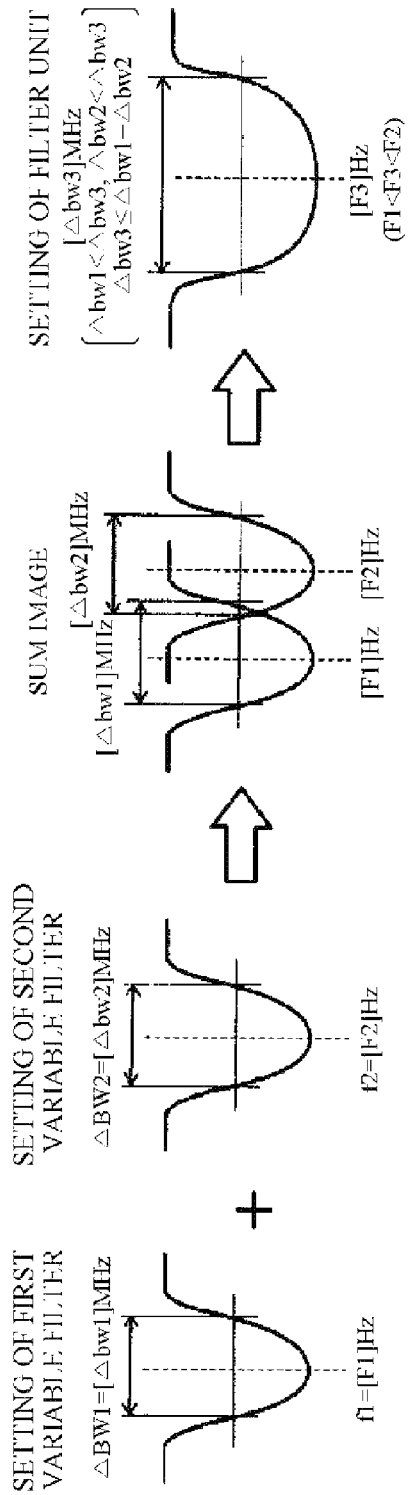
FIG. 4

FIG. 6

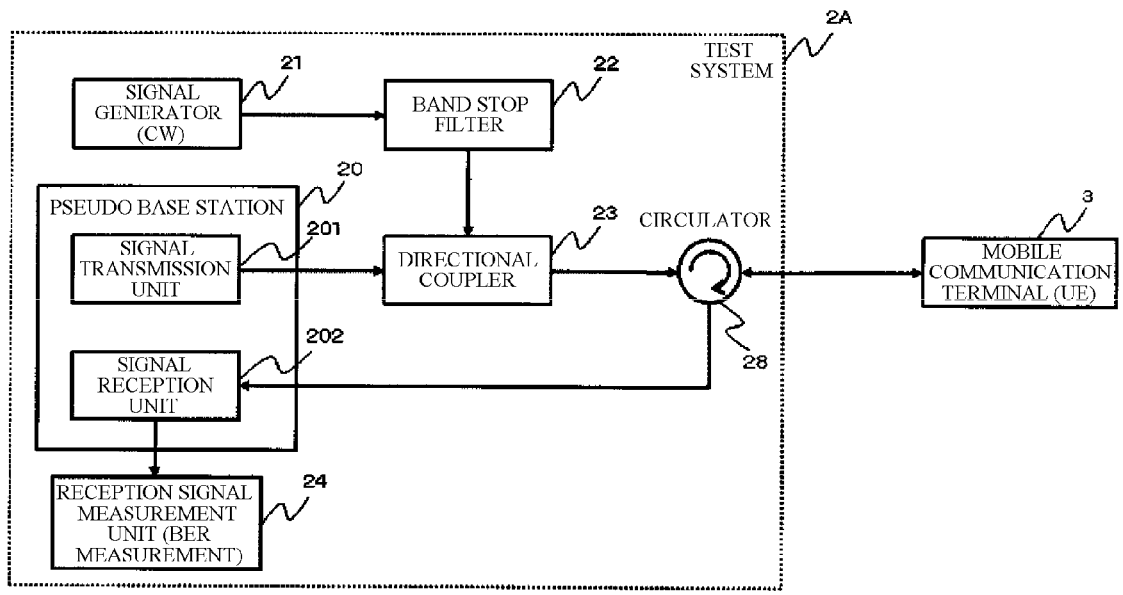

FIG. 7

| E-UTRA Operating Band | Downlink (DL) eNode B receive UE receive | | | MEASUREMENT CONDITIONS | | FILTER CHARACTERISTIC | FILTER FREQUENCY SETTING (TUNING FREQUENCIES) | |
|---|---|---|---|---|---|---|---|---|
| | F_UL_low | – | F_UL_hight | CENTER FREQUENCY | BANDWIDTH | BANDWIDTH | Filter 1 | Filter 2 |
| 1 | 2110 MHz | – | 2170 MHz | 2140 MHz | 15 MHz | 14 MHz | 2138 MHz | 2142 MHz |
| 2 | 1930 MHz | – | 1990 MHz | 1960 MHz | 15 MHz | 13 MHz | 1958 MHz | 1962 MHz |
| 3 | 1805 MHz | – | 1880 MHz | 1844 MHz | 20 MHz | 12 MHz | 1839 MHz | 1847 MHz |
| 4 | 2110 MHz | – | 2155 MHz | 2133 MHz | 20 MHz | 14 MHz | 2129 MHz | 2137 MHz |
| 5 | 869 MHz | – | 894 MHz | 882 MHz | 5 MHz | 8 MHz | 882 MHz | 882 MHz |
| 7 | 2620 MHz | – | 2690 MHz | 2655 MHz | 20 MHz | 14 MHz | 2652 MHz | 2658 MHz |
| ... | ... | ... | ... | | | ... | ... | ... |

FIG.8

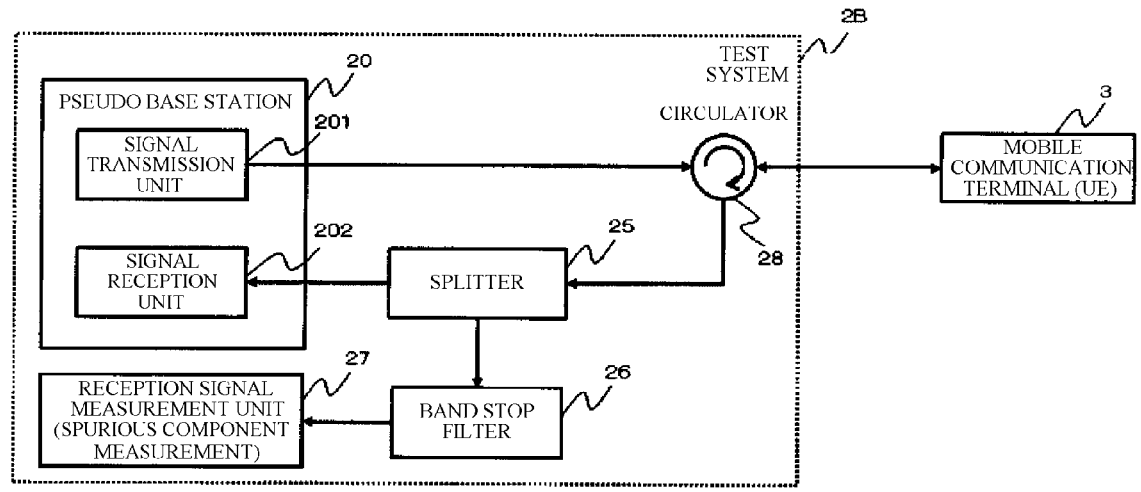

FIG.9

| E-UTRA Operating Band | Uplink (UL) eNode B receive UE transmit | | | MEASUREMENT CONDITIONS | | FILTER CHARACTERISTIC | FILTER FREQUENCY SETTING (TUNING FREQUENCIES) | |
|---|---|---|---|---|---|---|---|---|
| | F_UL_low | — | F_UL_hight | CENTER FREQUENCY | BANDWIDTH | BANDWIDTH | Filter 1 | Filter 2 |
| 1 | 1920 MHz | — | 1980 MHz | 1950 MHz | 15 MHz | 13 MHz | 1948 MHz | 1952 MHz |
| 2 | 1850 MHz | — | 1910 MHz | 1880 MHz | 15 MHz | 13 MHz | 1878 MHz | 1882 MHz |
| 3 | 1710 MHz | — | 1785 MHz | 1748 MHz | 20 MHz | 12 MHz | 1744 MHz | 1752 MHz |
| 4 | 1710 MHz | — | 1755 MHz | 1733 MHz | 20 MHz | 12 MHz | 1729 MHz | 1737 MHz |
| 5 | 824 MHz | — | 849 MHz | 837 MHz | 5 MHz | 7 MHz | 837 MHz | 837 MHz |
| 7 | 2500 MHz | — | 2570 MHz | 2535 MHz | 20 MHz | 14 MHz | 2532 MHz | 2538 MHz |
| ... | ... | ... | ... | | | ... | ... | ... |

FILTER UNIT, MOBILE COMMUNICATION TERMINAL TEST SYSTEM, AND MOBILE COMMUNICATION TERMINAL TEST METHOD

TECHNICAL FIELD

The present invention relates to a filter unit which attenuates a signal of a predetermined frequency band within a frequency band used in mobile communication. More particularly, the present invention relates to a technology of attenuating a signal of a predetermined frequency band which interferes with verification in a test system which has a pseudo base station function communicable and connectable with a mobile communication terminal and verifies the performance of interference wave immunity of the mobile communication terminal or verifies a spurious component included in a transmission wave from the mobile communication terminal.

BACKGROUND ART

Among "multiple access" schemes by which a plurality of users can simultaneously communicate with each other, a CDMA (Code Division Multiple Access) scheme having excellent frequency use efficiency has been commercialized by a plurality of methods. Among these schemes, particularly, one scheme of a global standard IMT-2000 defined by International Telecommunication Union (ITU) is W-CDMA (Wideband-Code Division Multiple Access). Mobile communication terminals using the above-described access scheme have been commercialized. Also, a next-generation mobile communication standard called LTE (Long Term Evolution) has been formulated.

A communication scheme or a data format related to the above-described W-CDMA or LTE scheme has been studied by 3GPP (3rd Generation Partnership Project), and standardized as a global standard. Mobile communication terminals and base station devices should conform to the above-described standard.

Test content and measurement items for checking the conformance to the 3GPP standard are defined as a conformance test. A test system for performing the conformance test is provided. The conformance test includes an interference wave test which verifies the performance of interference wave immunity of a mobile communication terminal and a transmission test which verifies the effect of a spurious component included in a transmission wave from the mobile communication terminal.

In an interference wave test, the conformance to the standard is checked by transmitting a pseudo base station signal combined with an interference wave from a test system including a pseudo base station to the mobile communication terminal and checking/verifying whether the mobile communication terminal returns an accurate response signal to the pseudo base station signal. When the interference wave is combined with the pseudo base station signal, a component corresponding to a frequency band of a carrier is excluded from a signal of the interference wave generated by a signal generator so as to prevent a carrier component from being affected by a spurious component of the interference wave, and the interference wave and the pseudo base station signal are combined.

In a transmission test, the conformance to the standard is checked by transmitting a pseudo base station signal from the test system including the pseudo base station to the mobile communication terminal and measuring a spurious component included in a signal returned from the mobile communication terminal. Since a signal component corresponding to an original response signal is outside a measurement target when the spurious component is measured, the spurious component is measured by excluding a component corresponding to a frequency band of the original response signal from the returned signal.

In the interference wave test and the transmission test as described above, a function called a band stop filter which excludes a component of a specific frequency band is necessary. In these tests, it is necessary to respectively verify signals of various frequency bandwidths defined by the 3GPP standard in a frequency band (for example, from 500 MHz to 4 GHz) used for mobile communication. Hereinafter, a frequency band used in mobile communication is called a communication frequency band.

Recently, it is necessary to add/change a frequency band range capable of being verified even for the test system since a specification range is extended such as formulating an LTE standard including a technical specification of HSPA (High Speed Packet Access) or the like serving as a higher standard of W-CDMA and therefore an available frequency band is also added/changed. That is, there are various frequencies and bandwidths to be used for communication by frequency band allocation of a communication standard or communication provider. Thus, a band stop filter of the test system should adapt to various frequencies and bandwidths.

RELATED ART DOCUMENT

Patent Document

[Patent Document 1] Japanese Unexamined Patent Application Publication No. 2006-128913

DISCLOSURE OF THE INVENTION

Problem that the Invention is to Solve

However, a plurality of fixed filters as a band stop filter is switched and used in the test system of the related art as in the test device disclosed in Patent Document 1. Thus, it is necessary to add a filter associated with an extension of a frequency band, and hence an increase of a housing size associated with a hardware increase, an increase of production cost, and an increase of the number of processes associated with the construction of a system or the adjustment of each variable filter become problems.

The present invention has been made to solve the above-described problems, and an object of the invention is to provide a filter unit and a test system using the same that are flexibly adaptable to the addition/change of a specification, that is, a change of an available frequency band range, by flexibly adapting to a frequency of a signal to be attenuated and a frequency band thereof in a frequency band for mobile communication and flexibly adapting to various frequency bands without newly adding/changing hardware.

Means for Solving the Problems

According to an invention of a first embodiment for accomplishing the above-described object, there is provided a filter unit which is used in a mobile communication terminal test system and attenuates a desired signal in a frequency band for mobile communication, including: first and second variable filters which are connected to each other in series, respectively have YIG elements to vary tuning frequencies, and attenuate the desired signal within predetermined bandwidths having centers of the tuning frequencies, wherein the tuning frequency of the first variable filter and the tuning frequency of the second variable filter are controlled to be the same as each other or around each other so that the desired signal is included in the predetermined bandwidth of each of the first variable filter and the second variable filter when the desired signal is located at a low frequency band side of the communication frequency band, and wherein the tuning frequency of the first variable filter and the tuning frequency of the second variable filter are controlled to include the desired signal in a connected bandwidth and to make the connected bandwidth wider than any of the predetermined bandwidth of the first variable filter and the predetermined bandwidth of the second variable filter when the desired signal is located at a high frequency band side of the communication frequency band.

According to an invention of a second embodiment, there is provided a mobile communication terminal test system which performs communication between a mobile communication terminal and a pseudo base station which perform communication using a frequency band of one of a plurality of frequency bands specified by a communication standard and tests the influence on a mobile communication terminal by an interference wave, including: the pseudo base station including a signal transmission unit which transmits a base station signal and a signal reception unit which receives a response signal transmitted by the mobile communication terminal in response to the base station signal; a signal generator which outputs the interference wave; a band stop filter which attenuates a signal of the frequency band corresponding to the base station signal from the interference wave; a directional coupler which couples the base station signal to the interference wave from the band stop filter and outputs a coupled signal to the mobile communication terminal; and a reception signal measurement unit which measures the response signal received by the signal reception unit from the mobile communication terminal, wherein the filter unit of the first embodiment is used in the band stop filter.

According to an invention of a third embodiment, there is provided a mobile communication terminal test system which performs communication between a mobile communication terminal and a pseudo base station which perform communication using a frequency band of one of a plurality of frequency bands specified by a communication standard and measures a spurious component included in a signal transmitted from the mobile communication terminal, including: the pseudo base station including a signal transmission unit which transmits a base station signal and a signal reception unit which receives a response signal transmitted by the mobile communication terminal in response to the base station signal; a band stop filter which attenuates a signal of the frequency band to be used by the mobile communication terminal from the response signal; and a reception signal measurement unit which measures a spurious component included in the signal from the band stop filter, wherein the filter unit of the first embodiment is used in the band stop filter.

According to an invention of a fourth embodiment, there is provided a mobile communication terminal test method of performing communication between a mobile communication terminal and a pseudo base station which perform communication using a frequency band of one of a plurality of frequency bands specified by a communication standard and testing the influence on a mobile communication terminal by an interference wave, comprising the steps of: transmitting a base station signal from the pseudo base station; outputting the interference wave; attenuating a signal of the frequency band corresponding to the base station signal from the interference wave by a filter unit having first and second variable filters which are connected to each other in series, respectively have YIG elements to vary tuning frequencies, and attenuate the desired signal within predetermined bandwidths having centers of the tuning frequencies; coupling the base station signal and the interference wave from which the signal of the frequency band corresponding to the base station signal is attenuated, and outputting a coupled signal to the mobile communication terminal; receiving, by the pseudo base station, a response signal transmitted by the mobile communication terminal in response to the base station signal; and measuring the response signal received by the pseudo base station, wherein the attenuating step: controls the tuning frequency of the first variable filter and the tuning frequency of the second variable filter to be the same as each other or around each other so that the frequency band corresponding to the base station signal is included in the predetermined bandwidth of each of the first variable filter and the second variable filter when the frequency band corresponding to the base station signal is located at a low frequency band side of the plurality of frequency bands; and controls the tuning frequency of the first variable filter and the tuning frequency of the second variable filter to include the frequency band corresponding to the base station signal in a connected bandwidth and to make the connected bandwidth wider than any of the predetermined bandwidth of the first variable filter and the predetermined bandwidth of the second variable filter when the frequency band corresponding to the base station signal is located at a high frequency band side of the plurality of frequency bands.

According to an invention of a fifth embodiment, there is provided a mobile communication terminal test method of performing communication between a mobile communication terminal and a pseudo base station which perform communication using a frequency band of one of a plurality of frequency bands specified by a communication standard and measuring a spurious component included in a signal transmitted from the mobile communication terminal, including the steps of: transmitting, by the pseudo base station, a base station signal to the mobile communication terminal, attenuating a signal of the frequency band to be used by the mobile communication terminal from a response signal transmitted by the mobile communication terminal in response to the base station signal by a filter unit having first and second variable filters which are connected to each other in series, respectively have YIG elements to vary tuning frequencies, and attenuate the desired signal within predetermined bandwidths having centers of the tuning frequencies; and measuring a spurious component included in the attenuated response signal, wherein the attenuating step: controls the tuning frequency of the first variable filter and the tuning frequency of the second variable filter to be the same as each other or around each other so that the frequency band to be used by the mobile communication terminal is included in the predetermined bandwidth of each of the first variable filter and the second variable filter when the frequency band to be used by the mobile communication terminal is located at a low frequency band side of the plurality of frequency bands; and controls the tuning frequency of the first variable filter and the tuning frequency of the second variable filter to include the frequency band to be used by the mobile communication terminal in a connected bandwidth and to make the connected bandwidth wider than any of the predetermined bandwidth of the first variable filter and the predetermined bandwidth of the second variable filter when the frequency band to be used by the mobile communication terminal is located at a high frequency band side of the plurality of frequency bands.

Advantage of the Invention

According to the present invention, adaptation is possible without newly adding a filter unit even though a frequency bandwidth to be tested is added/changed since a bandwidth of a signal to be attenuated or a loss amount can be changed by adjusting tuning frequencies of a first variable filter 102 and a second variable filter 103.

Since the number of filters constituting a filter unit is decreased, it is possible to reduce a size and weight of a housing and to reduce the number of processes associated with the construction of a system such as a filter connection, initial adjustment, and the like, and the number of maintenance processes such as filter adjustment (calibration) and the like.

BRIEF DESCRIPTION OF THE DRAWINGS

FIG. 1 is a functional block diagram of a filter unit according to a first embodiment.

FIGS. 2A and 2B are diagrams illustrating a difference between the filter unit according to the first embodiment and a filter unit of the related art.

FIG. 3A is a diagram illustrating a frequency bandwidth of a variable filter used by the filter unit according to the first embodiment.

FIG. 3B is a diagram illustrating a signal attenuation operation by the filter unit according to the first embodiment.

FIGS. 4A and 4B are diagrams illustrating an example of setting the filter unit according to the first embodiment.

FIG. 6 is a system block diagram of a mobile communication terminal test system according to a second embodiment.

FIG. 7 is an example of setting a frequency of a filter unit in the mobile communication terminal test system according to the second embodiment.

FIG. 8 is a system block diagram of a mobile communication terminal test system according to a third embodiment.

FIG. 9 is an example of setting a frequency of a filter unit in the mobile communication terminal test system according to the third embodiment.

BEST MODE FOR CARRYING OUT THE INVENTION

First Embodiment

Figure 5:
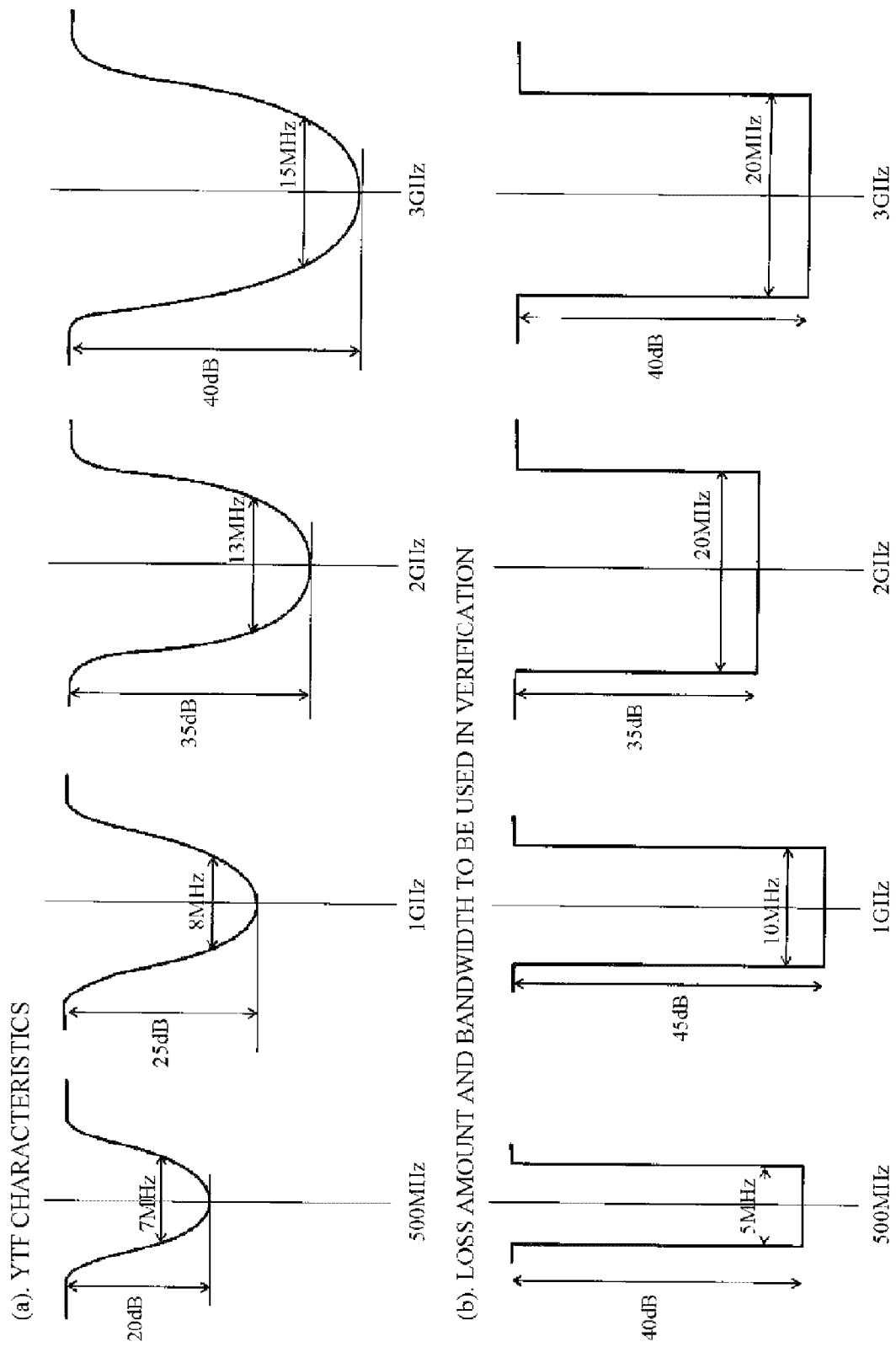
FIGS. 5A and 5B are diagrams illustrating an example of YTF frequency characteristics for a predetermined frequency and a loss amount and a bandwidth necessary for a test at each frequency.

The configuration and operation of a filter unit according to the first embodiment will be described with reference to FIG. 1. The filter unit according to the first embodiment is a band stop filter which attenuates a predetermined frequency component from an input signal, and changes a frequency component to be attenuated by switching settings of a filter.

FIGS. 2A and 2B are conceptual diagrams for a comparison between a filter unit using a scheme of the related art and the filter unit according to this embodiment. In the scheme of the related art, a frequency component to be attenuated is changed by switching a fixed filter to be used by embedding a plurality of fixed filters in the filter unit. The filter unit according to this embodiment adapts to a plurality of frequency components by using a combination of at least two variable filters.

In FIG. 1, a filter unit 10 includes a band stop type of first variable filter 102 and a band stop type of second variable filter 103 connected in series, and a drive unit 101 which independently controls the operation of each of the first variable filter 102 and the second variable filter 103.

The first variable filter 102 and the second variable filter 103 are used as a filter having a characteristic that a resonance frequency fi (hereinafter, referred to as "tuning frequency") is linearly varied at the time of linearly changing a current directed to each variable filter and a characteristic (that is, a band stop characteristic) of attenuating a component of a predetermined frequency bandwidth ΔBW including a tuning frequency fi from a signal input to the same filter in at least a communication frequency band (for example, from 500 MHz to 4 GHz). Here, FIG. 3A is a diagram illustrating the frequency bandwidth ΔBW of the variable filter. As shown in FIG. 3A, it is assumed that the frequency bandwidth ΔBW to be attenuated by the filter is a bandwidth of the filter in a position of +6 dB from the level of the tuning frequency fi.

The first variable filter 102 and the second variable filter 103 are connected in series and an output signal of the first variable filter 102 is input to the second variable filter 103. FIG. 3B is a diagram illustrating a signal attenuation operation by the filter unit 10. As shown in FIG. 3B, an input signal input to the filter unit 10 is output from the filter unit 10 after the first variable filter 102 attenuates a signal of a frequency component having a first frequency bandwidth ΔBW1 with the center of a tuning frequency f1, and the second variable filter 103 attenuates a frequency component having a second frequency bandwidth ΔBW2 with the center of a tuning frequency f2.

(YTF Characteristics)

An example of a variable filter to be used as the first variable filter 102 and the second variable filter 103 may be a YTF (YIG Tuned Filter). As is well known, the YTF is a band rejection filter in which a tuning frequency using a characteristic that a resonance frequency is linearly varied at the time of linearly varying a direct-current magnetic field of a YIG (Yttrium Iron Garnet) single crystal is variable. If the YTF is used in the first variable filter 102 and the second variable filter 103, the direct-current magnetic field of the YIG single crystal of each variable filter is varied by controlling the current which controls the magnetic field of each variable filter, and the tuning frequency of the filter is changed.

In general, the YTF has a feature that the control of a tuning frequency is facilitated and good characteristics are obtained at a high frequency of a GHz band. On the other side thereof, the YTF has a characteristic that a loss amount and a frequency bandwidth of the filter are varied in synchronization with a tuning frequency simultaneously when a frequency (tuning frequency) resonating at the time of linearly varying the direct-current magnetic field of the single crystal is varied in a broad band including a band of GHz or less.

Here, in the example of FIG. 5A, characteristics of a loss amount and a frequency bandwidth of passage stop with respect to the tuning frequency of the YTF will be specifically described. FIG. 5A is a diagram showing an example of YTF characteristics, that is, a loss amount and a frequency bandwidth for a tuning frequency.

In FIG. 5A, if the tuning frequency is 500 MHz, the available frequency bandwidth is 7 MHz and the loss amount is 20 dB. If the tuning frequency is 3 GHz, the available frequency bandwidth is 15 MHz and the loss amount is wider than that in the tuning frequency of 500 MHz and is greater than 40 dB.

In the YTF as described above, the frequency bandwidth is narrow and the loss amount is small in a low frequency band. However, as the tuning frequency is high, the frequency bandwidth may be wider and the loss amount may be larger. In the present invention, the control unit 11 controls the variable filter by using the YTF characteristics as follows.

(Setting of Frequency of Variable Filter)

Next, a method of setting a frequency bandwidth of a filter unit according to this embodiment will be described. In the filter unit according to this embodiment, a tuning frequency of each of the first variable filter 102 and the second variable filter 103 is individually set and a frequency band of passage stop in the filter unit is set using a combination thereof.

FIGS. 4A and 4B are conceptual diagrams showing an example of setting the filter unit according to this embodiment. FIG. 4A shows a setting example when a loss amount of passage stop is set to be large and FIG. 4B shows a setting example when a bandwidth of passage stop is set to be wide.

Since the first variable filter 102 and the second variable filter 103 are connected in series, a loss amount is added by causing the first frequency bandwidth ΔBW1 and the second frequency bandwidth ΔBW2 to overlap. As shown in FIG. 4A, it is possible to obtain a larger loss amount than in the case where each variable filter is used as a stand-alone type by setting the tuning frequency f1 and the tuning frequency f2 to be the same as each other or around each other.

Specifically, if the tuning frequency f1 and the first frequency bandwidth ΔBW1 of the first variable filter 102 and the tuning frequency f2 and the second frequency bandwidth ΔBW2 of the second variable filter 103 are set so that the following relational expression is established, it is possible to obtain a larger loss amount than in the case where each variable filter is used as the stand-alone type.

$$0 \leq |f1-f2| < |\Delta BW1 + \Delta BW2|/4$$

A frequency bandwidth ΔBW of a frequency component Δf serving as a target to be removed by the filter unit 10 is set in a range including both the frequency bandwidth ΔBW1 of the first variable filter 102 and the frequency bandwidth ΔBW2 of the second variable filter 103. Thus, as shown in FIG. 4B, it is possible to obtain a wider frequency bandwidth than in the case where each variable filter is used as the stand-alone type by setting the tuning frequency f1 of the first variable filter 102 and the tuning frequency f2 of the second variable filter 103 so that the first frequency bandwidth ΔBW1 is connected to the second frequency bandwidth ΔBW2.

Specifically, if the tuning frequency f1 and the first frequency bandwidth ΔBW1 of the first variable filter 102 and the tuning frequency f2 and the second frequency bandwidth ΔBW2 of the second variable filter 103 are set so that the following relational expression is established, it is possible to obtain a wider bandwidth.

$$0 < |f1-f2| < |\Delta BW1 + \Delta BW2|/2$$

A more specific setting example will now be described with reference to FIG. 5B. FIG. 5B is a diagram showing an example of test conditions (a loss amount and a frequency bandwidth) at each frequency. In a low frequency band in a communication frequency band, the case where a loss amount necessary in the test may not be obtained by the above-described YTF characteristics is assumed. For example, the loss amount necessary in the test is 40 dB in the test condition of 500 MHz of FIG. 5B, but a necessary loss amount is not obtained since the loss amount obtained by a stand-alone YTF is 20 dB. In this case, it is possible to obtain a necessary loss amount by setting for obtaining a larger loss amount, that is, by setting both the tuning frequency f1 of the first variable filter and the tuning frequency f2 of the second variable filter to the center frequency 500 MHz (or its vicinity) of the test condition.

In contrast, in a high frequency band in a communication frequency band, the case where the resonance sharpness becomes high as the tuning frequency becomes high and therefore a necessary frequency band may not be obtained is assumed. For example, the frequency bandwidth necessary in the test is 20 MHz in the test condition of 3 GHz of FIG. 5B, but a necessary frequency bandwidth is not obtained since the frequency bandwidth obtained by the stand-alone YTF is 15 MHz. In this case, it is possible to connect the first frequency bandwidth ΔBW1 of the first variable filter and the second frequency bandwidth ΔBW2 of the second variable filter to obtain a bandwidth necessary in the test by setting for obtaining a wider bandwidth, that is, by setting the tuning frequency f1 of the first variable filter to be shifted to 2.9975 GHz and setting the tuning frequency f2 of the second variable filter to be shifted to 3.0025 GHz with respect to the center frequency 3 MHz of the test condition.

The drive unit 101 has means for individually adjusting the frequency bandwidth of each of the first variable filter 102 and the second variable filter 103. If the YTF is used in the first variable filter 102 and the second variable filter 103, the tuning frequency of each variable filter is changed by individually adjusting a current value of a current to be supplied to each variable filter.

The control unit 11 controls the operation of the drive unit 101 and changes the frequency bandwidth of the first variable filter 102 or the second variable filter 103 as shown in the above-described "Setting of Frequency of Variable Filter". The control unit 11 may be arranged outside the filter unit 10, and may be embedded in the filter unit 10.

Thereby, for adaptation to a plurality of frequency bands, it is necessary to prepare a fixed filter of a corresponding frequency band as a band stop filter in the related art, but it is possible to reproduce various frequency bands without adding hardware (a filter) by applying the filter unit according to this embodiment.

Even though a variable filter having frequency characteristics such as the YTF is used as each variable filter by a configuration which connects the first variable filter and the second variable filter in series and individually controls each variable filter, it is possible to reproduce test conditions, that is, a loss amount and a frequency bandwidth, which are difficult to be reproduced when the filter is used as the stand-alone type by the filter characteristics, for example, the influence on the frequency bandwidth due to a low loss amount in a low frequency band or a level of the resonance sharpness in a high frequency band.

It is possible to reduce a size and weight of the filter unit itself since the number of hardware elements (filters) constituting the filter unit is decreased.

SECOND EMBODIMENT

Next, the configuration and operation of a mobile communication terminal test system according to the second embodiment will be described with reference to FIG. 6. FIG. 6 is a system block diagram of a mobile communication terminal test system 2A according to this embodiment.

The mobile communication terminal test system according to the second embodiment verifies the performance of interference wave immunity of the mobile communication terminal in a conformance test system which implements an authentication test based on the specification of the international standard 3GPP, particularly, Chapter 6 (reception test)

of the TS 34.121 standard, for example, since a mobile communication terminal of a test target is a mobile phone.

A mobile communication terminal 3 is a terminal to be tested, and receives a base station signal from a pseudo base station 20 to be described later and transmits a response signal to the pseudo base station 20.

The pseudo base station 20 includes a signal transmission unit 201 which transmits the pseudo base station signal to the mobile communication terminal 3 and a signal reception unit 202 which receives and demodulates the response signal from the mobile communication terminal 3.

The signal transmission unit 201 modulates a carrier of a designated frequency by a predetermined coding/modulation scheme in a frequency band of a range defined by a standard, and outputs a pseudo base station signal.

The signal reception unit 202 receives a response signal from the mobile communication terminal 3 as the terminal to be tested, and demodulates a carrier of a designated frequency by a predetermined coding/demodulation scheme (a coding/demodulation scheme corresponding to the code/modulation scheme used in the signal transmission unit 201). The mobile communication terminal 3 can check whether the pseudo base station signal transmitted by the signal transmission unit 201 is accurately received by measuring the signal demodulated by the signal reception unit 202.

A signal generator 21 outputs a continuous wave signal, that is, a non-modulation signal set by the step of 1 MHz of a frequency band (for example, 1 MHz to 12.75 GHz) serving as a measurement target, as an interference wave to a pseudo base station signal wave.

A band stop filter 22 passes frequency components outside a frequency band of the pseudo base station signal output by the signal transmission unit 201 among frequency components of the continuous wave signal output by the signal generator 21, and suppresses only a component corresponding to the frequency band of the pseudo base station signal. In other words, the frequency band of the pseudo base station signal is largely attenuated and a flat frequency characteristic having a small pass loss for a band other than the attenuation band is preferable.

In the mobile communication terminal test system according to this embodiment, the filter unit according to the first embodiment is applied to the band stop filter 22. A filter setting method when the filter unit according to the first embodiment is used as the band stop filter 22 will be described with reference to FIG. 7. FIG. 7 is a table in which an example of test conditions (frequency bandwidths) of an interference wave test among conformance tests and an example of setting tuning frequencies of the first variable filter and the second variable filter in the same conditions are arranged.

In FIG. 7, "E-UTRA Operating Band" indicates a number of an allocated frequency band. "Downlink (DL) eNode B receive UE receive" indicates a frequency band of a communication signal from the pseudo base station to the mobile communication terminal. "F_UL_low" indicates a lower end of the frequency band and "F_UL_high" indicates an upper end thereof "Measurement Conditions" indicate an example of measurement conditions in each frequency band, and indicate "Center Frequency" and "Bandwidth" as the measurement conditions. In "Filter Characteristic", a bandwidth (band stop characteristic) of a signal to be attenuated by each variable filter constituting the band stop filter 22 around "Center Frequency" of "Measurement Conditions" is written. In this test, a signal of a frequency band corresponding to "Measurement Conditions" among signals from the pseudo base station to the mobile communication terminal is attenuated from an interference wave. In this case, a setting example of the filter unit is an example of setting the tuning frequencies of the first variable filter (Filter 1) and the second variable filter (Filter 2) written in "Filter Frequency Setting (Tuning Frequencies)".

For example, if each variable filter constituting the band stop filter 22 is used as the stand-alone type in a low frequency band as in conditions of E-UTRA Operating Band No. 5, the loss amount becomes 24 dB. As in an example of 500 MHz in FIGS. 5A and 5B, a loss amount (for example, from 35 dB to 45 dB) necessary in the test may not be obtained. Thus, a necessary loss amount is obtained by setting both the tuning frequencies of the first variable filter and the second variable filter constituting the band stop filter 22 to 882 MHz as the center frequency of the measurement conditions (setting for obtaining a larger loss amount).

For example, if each variable filter constituting the band stop filter 22 is used as the stand-alone type in a high frequency band as in conditions of E-UTRA Operating Band No. 7, a band stop characteristic (bandwidth) becomes 14 MHz and hence a bandwidth of 20 MHz necessary in the test is not obtained. Thus, a necessary bandwidth is obtained by setting the tuning frequency f1 of the first variable filter constituting the band stop filter 22 to 2652 MHz and setting the tuning frequency f2 of the second variable filter to 2658 MHz so as to connect the first frequency bandwidth ΔBW1 of the first variable filter to the second frequency bandwidth ΔBW2 of the second variable filter (setting for obtaining a wider bandwidth).

Settings of test conditions to the band stop filter 22 may be configured to be changed by an operator for each measurement condition, and may be configured to be changed by the control unit which controls the filter unit on the basis of setting conditions stored in a database by connecting a storage medium like the database storing in advance setting conditions in each test shown in FIG. 7 to the control unit which controls the band stop filter 22 (the control unit 11 which controls the filter unit).

A directional coupler 23 is a broadband coupler which passes an output frequency of the signal generator 21, and combines an interference wave from the signal generator 21 with a pseudo base station signal from the signal transmission unit 201 and outputs the combined signal to the mobile communication terminal 3 as the terminal to be tested.

A circulator 28 transmits the signal from the directional coupler 23 to the mobile communication terminal 3, and transmits a signal from the mobile communication terminal 3 to the signal reception unit 202.

The mobile communication terminal 3 receives the pseudo base station signal combined with the interference wave by the directional coupler 23, and also returns a response signal to the pseudo base station 20. The signal reception unit 202 of the pseudo base station 20 receives and demodulates the response signal.

The reception signal measurement unit 24 receives a signal demodulated by the signal reception unit 202, measures a bit error rate (BER) to estimate a level of the effect of the interference wave, and outputs a measurement result. Since the reception signal measurement unit 24 which measures the bit error rate is well known to those in the art and is not directly related to the present invention, description of a detailed configuration thereof is omitted.

Third Embodiment

Next, the configuration and operation of a mobile communication terminal test system according to the third embodiment will be described with reference to FIG. 8. FIG. 8 is a system block diagram of a mobile communication terminal test system 2B according to this embodiment.

The mobile communication terminal test system according to the third embodiment verifies the conformance to a standard related to a spurious component included in a response signal from the mobile communication terminal in a conformance test system which implements an authentication test based on the specification of the international standard 3GPP, particularly, Chapter 5 (transmission test) of the TS 34.121 standard, for example, since a mobile communication terminal of a test target is a mobile phone.

In this test, the influence of the spurious component included in the response signal is verified by receiving a pseudo base station signal transmitted from a pseudo base station 20 and measuring the response signal returned by a mobile communication terminal 3 as the terminal to be tested. Since the configurations and operations of the pseudo base station 20 including a signal transmission unit 201 and a signal reception unit 202 according to this embodiment and the mobile communication terminal 3 are the same as those of the mobile communication terminal test system according to the second embodiment, description thereof is omitted.

A splitter 25 splits a response signal wave from the mobile communication terminal 3, and inputs the split response signal wave to both the signal reception unit 202 and a reception signal measurement unit 27.

A band stop filter 26 passes only frequency components outside a frequency band corresponding to a carrier of a response signal wave among frequency components of the response signal wave signal input to the reception signal measurement unit 27, and suppresses only a component of the frequency band of the response signal carrier. In other words, the frequency band corresponding to the response signal carrier is largely attenuated and a flat frequency characteristic having a small pass loss for a band other than the attenuation band is preferable.

In the mobile communication terminal test system according to this embodiment, the filter unit according to the first embodiment is applied to the band stop filter 26. A filter setting method when the filter unit according to the first embodiment is used as the band stop filter 26 will be described with reference to FIG. 9. FIG. 9 is a table in which an example of test conditions (frequency bandwidths) of a transmission test among conformance tests and an example of setting tuning frequencies of the first variable filter and the second variable filter in the same conditions are arranged.

In FIG. 9, "E-UTRA Operating Band" indicates a number of an allocated frequency band. "Uplink (UL) eNode B receive UE transmit" indicates a frequency band of a communication signal from the mobile communication terminal 3. "F_UL_low" indicates a lower end of the frequency band and "F_UL_high" indicates an upper end thereof. "Measurement Conditions" indicate an example of measurement conditions in each frequency band, and indicate "Center Frequency" and "Bandwidth" as the measurement conditions. In "Filter Characteristic", a bandwidth (band stop characteristic) of a signal to be attenuated by each variable filter constituting the band stop filter 26 around "Center Frequency" of "Measurement Conditions" is written. In this test, a signal of the frequency band corresponding to a communication signal is attenuated from the signal returned by the mobile communication terminal 3. In this case, a setting example of the filter unit is an example of setting the tuning frequencies of the first variable filter (Filter 1) and the second variable filter (Filter 2) written in "Filter Frequency Setting (Tuning Frequencies)".

For example, when each variable filter constituting the band stop filter 26 is used as a stand-alone type in a low frequency band as in conditions of E-UTRA Operating Band No. 5, the loss amount becomes 23 dB. As in an example of 500 MHz in FIGS. 5A and 5B, a loss amount (for example, from 35 dB to 45 dB) necessary in the test may not be obtained. Thus, a necessary loss amount is obtained by setting both the tuning frequencies of the first variable filter and the second variable filter constituting the band stop filter 26 to 837 MHz as the center frequency of the measurement conditions (setting for obtaining a larger loss amount).

For example, when each variable filter constituting the band stop filter 26 is used as a stand-alone type in a high frequency band as in conditions of E-UTRA Operating Band No. 7, a band stop characteristic (bandwidth) becomes 14 MHz and a bandwidth of 20 MHz necessary in the test may not be obtained. Thus, a necessary bandwidth is obtained by setting the tuning frequency f1 of the first variable filter constituting the band stop filter 26 to 2532 MHz and setting the tuning frequency f2 of the second variable filter to 2538 MHz so as to connect the first frequency bandwidth ΔBW1 of the first variable filter to the second frequency bandwidth ΔBW2 of the second variable filter (setting for obtaining a wider bandwidth).

Settings of test conditions to the band stop filter 26 may be configured to be changed by an operator for each measurement condition, and may be configured to be changed by the control unit which controls the filter unit on the basis of setting conditions stored in a database by connecting a storage medium like the database storing in advance setting conditions in each test shown in FIG. 9 to the control unit which controls the band stop filter 26 (the control unit 11 which controls the filter unit).

The reception signal measurement unit 27 measures a signal level of each frequency component included in a response signal from the mobile communication terminal 3 as the terminal to be tested, and checks that level values are equal to or less than a specified value.

Since the frequency band component corresponding to the carrier of the response signal is attenuated by the band stop filter 26 from the response signal input from the mobile communication terminal 3 to the reception signal measurement unit 27, it is possible to measure only a spurious component such as a harmonic wave or the like included in the response signal.

For example, even though the test conditions as shown in FIG. 7 or 9 are changed by a specification change since the filter unit according to the first embodiment is applied to the band stop filter 22 and the band stop filter 26 in the mobile communication terminal test system according to the second and third embodiments as described above, it is necessary to tune each fixed filter after each fixed filter constituting the band stop filter is changed in the related art, but flexible adaptation is possible by changing setting conditions in each test, that is, the tuning frequency f1 of the first variable filter constituting the filter unit and the tuning frequency f2 of the second variable filter in the mobile communication terminal test system according to this embodiment.

Since the number of hardware elements (filters) constituting the filter unit is decreased, the number of processes related to the construction of a system such as a wiring and the like or the number of processes related to adjustment occurring upon maintenance such as calibration of each filter is decreased. Since a size of the filter unit is decreased, it is possible to save on space regarding the mobile communication terminal test system.

DESCRIPTION OF REFERENCE NUMERALS 2A, 2B: MOBILE COMMUNICATION TERMINAL TEST SYSTEM
3: MOBILE COMMUNICATION TERMINAL
10: FILTER UNIT
11: CONTROL UNIT
20: PSEUDO BASE STATION
21: SIGNAL GENERATOR
22, 26: BAND STOP FILTER
23: DIRECTIONAL COUPLER
24: RECEPTION SIGNAL MEASUREMENT UNIT
25: SPLITTER
27: RECEPTION SIGNAL MEASUREMENT UNIT
28: CIRCULATOR
101: DRIVE UNIT
102: FIRST VARIABLE FILTER
103: SECOND VARIABLE FILTER
201: SIGNAL TRANSMISSION UNIT
202: SIGNAL RECEPTION UNIT

The invention claimed is:

1. A filter unit which is used in a mobile communication terminal test system and attenuates a desired signal in a frequency band for mobile communication, comprising:
first and second variable filters which are individually tunable and connected to each other in series, respectively have YIG elements to vary tuning frequencies, and attenuate the desired signal within predetermined bandwidths having centers of the tuning frequencies, wherein the tuning frequency of the first variable filter and the tuning frequency of the second variable filter are controlled to be the same as each other or around each other so that the desired signal is included in the predetermined bandwidth of both of the first variable filter and the second variable filter to increase attenuation of the desired signal when the desired signal is located at a low frequency band side of the communication frequency band,
wherein the tuning frequency of the first variable filter and the tuning frequency of the second variable filter are controlled to be different such that the desired signal is included in a connected bandwidth, which is formed from a concatenation of the predetermined bandwidths of the first and second variable filters and wider than any of the predetermined bandwidth of the first variable filter and the predetermined bandwidth of the second variable filter individually, when the desired signal is located at a high frequency band side of the communication frequency band,
wherein the filter unit is used in a band stop filter of the mobile communication terminal test system and attenuates a signal of a frequency band corresponding to a base station signal from an interference wave, and
wherein the mobile communication terminal test system performs communication between a mobile communication terminal and a pseudo base station which perform communication using a frequency band of one of a plurality of frequency bands specified by a communication standard and tests the influence on the mobile communication terminal by the interference wave, the mobile communication terminal test system comprising:
the pseudo base station including a signal transmission unit which transmits the base station signal and a signal reception unit which receives a response signal transmitted by the mobile communication terminal in response to the base station signal;
a signal generator which outputs the interference wave;
the band stop filter;
a directional coupler which couples the base station signal to the interference wave from the band stop filter and outputs a coupled signal to the mobile communication terminal; and
a reception signal measurement unit which measures the response signal received by the signal reception unit from the mobile communication terminal.

2. The filter unit of claim 1 wherein the desired signal is a signal in a frequency band corresponding to a base station signal from an interference wave, the interference wave being generated by a signal generator of the mobile communication terminal test system.

3. The filter unit of claim 1 wherein the desired signal is a signal in a frequency band to be used by a mobile communication terminal in response to a base station signal transmitted by a pseudo base station of the mobile communication terminal test system.

4. The filter unit of claim 1 wherein the tuning frequency of the first variable filter and the tuning frequency of the second variable filter are set according to the relationship $$0 \leq |f1-f2| < |\Delta BW1 + \Delta BW2|/4$$

when the desired signal is located at a low frequency band side of the communication frequency band,
wherein f1 and $\Delta BW1$ are the tuning frequency and frequency bandwidth of the first variable filter, and f2 and $\Delta BW2$ are the tuning frequency and frequency bandwidth of the second variable filter.

5. The filter unit of claim 1 wherein the tuning frequency of the first variable filter and the tuning frequency of the second variable filter are set according to the relationship $$0 < |f1-f2| < |\Delta BW1 + \Delta BW2|/2$$

when the desired signal is located at a high frequency band side of the communication frequency band,
wherein f1 and $\Delta BW1$ are the tuning frequency and frequency bandwidth of the first variable filter, and f2 and $\Delta BW2$ are the tuning frequency and frequency bandwidth of the second variable filter.

6. The filter unit of claim 4 wherein the tuning frequency of the first variable filter and the tuning frequency of the second variable filter are set according to the relationship $$0 < |f1-f2| < |\Delta BW1 + \Delta BW2|/2$$

when the desired signal is located at a high frequency band side of the communication frequency band.

7. A filter unit which is used in a mobile communication terminal test system and attenuates a desired signal in a frequency band for mobile communication, comprising:
first and second variable filters which are individually tunable and connected to each other in series, respectively have YIG elements to vary tuning frequencies, and attenuate the desired signal within predetermined bandwidths having centers of the tuning frequencies,
wherein the tuning frequency of the first variable filter and the tuning frequency of the second variable filter are controlled to be the same as each other or around each other so that the desired signal is included in the predetermined bandwidth of both of the first variable filter and the second variable filter to increase attenuation of the desired signal when the desired signal is located at a low frequency band side of the communication frequency band,
wherein the tuning frequency of the first variable filter and the tuning frequency of the second variable filter are controlled to be different such that the desired signal is included in a connected bandwidth, which is formed from a concatenation of the predetermined bandwidths of the first and second variable filters and wider than any of the predetermined bandwidth of the first variable filter and the predetermined bandwidth of the second variable filter individually, when the desired signal is located at a high frequency band side of the communication frequency band, wherein the filter unit is used in a band stop filter of the mobile communication terminal test system and which attenuates a signal of a frequency band to be used by a mobile communication terminal from a response signal, and wherein the mobile communication terminal test system performs communication between the mobile communication terminal and a pseudo base station which perform communication using a frequency band of one of a plurality of frequency bands specified by a communication standard and measures a spurious component included in a signal transmitted from the mobile communication terminal, the mobile communication terminal test system comprising:

the pseudo base station including a signal transmission unit which transmits a base station signal and a signal reception unit which receives the response signal transmitted by the mobile communication terminal in response to the base station signal;

the band stop filter; and a reception signal measurement unit which measures a spurious component included in the signal from the band stop filter.

8. The filter unit of claim 7 wherein the desired signal is a signal in a frequency band corresponding to a base station signal from an interference wave, the interference wave being generated by a signal generator of the mobile communication terminal test system.

9. The filter unit of claim 7 wherein the desired signal is a signal in a frequency band to be used by a mobile communication terminal in response to a base station signal transmitted by a pseudo base station of the mobile communication terminal test system.

10. The filter unit of claim 7 wherein the tuning frequency of the first variable filter and the tuning frequency of the second variable filter are set according to the relationship $$0 \leq |f1-f2| < |\Delta BW1 + \Delta BW2|/4$$

when the desired signal is located at a low frequency band side of the communication frequency band, wherein f1 and $\Delta BW1$ are the tuning frequency and frequency bandwidth of the first variable filter, and f2 and $\Delta BW2$ are the tuning frequency and frequency bandwidth of the second variable filter.

11. The filter unit of claim 7 wherein the tuning frequency of the first variable filter and the tuning frequency of the second variable filter are set according to the relationship $$0 < |f1-f2| < |\Delta BW1 + \Delta BW2|/4$$

when the desired signal is located at a high frequency band side of the communication frequency band, wherein f1 and $\Delta BW1$ are the tuning frequency and frequency bandwidth of the first variable filter, and f2 and $\Delta BW2$ are the tuning frequency and frequency bandwidth of the second variable filter.

12. The filter unit of claim 10 wherein the tuning frequency of the first variable filter and the tuning frequency of the second variable filter are set according to the relationship $$0 < |f1-f2| < |\Delta BW1 + \Delta BW2|/2$$

when the desired signal is located at a high frequency band side of the communication frequency band.

* * * * *